(12) United States Patent
Chen et al.

(10) Patent No.: US 7,303,937 B2
(45) Date of Patent: Dec. 4, 2007

(54) METHOD OF MANUFACTURING A QUANTUM-DOT ELEMENT

(75) Inventors: Hsueh-Shih Chen, Hsinchu (TW); Dai-Luon Lo, DahuTownship, Miaoli County (TW); Gwo-Yang Chang, Jiali Township, Tainan County (TW); Chien-Ming Chen, Yangmei Township, Taoyuan County (TW)

(73) Assignee: Industrial Technology Research Institute, Hsinchu (TW)

( * ) Notice: Subject to any disclaimer, the term of this patent is extended or adjusted under 35 U.S.C. 154(b) by 133 days.

(21) Appl. No.: 11/187,829

(22) Filed: Jul. 25, 2005

(65) Prior Publication Data
US 2006/0046330 A1   Mar. 2, 2006

(30) Foreign Application Priority Data
Aug. 23, 2004   (TW) .............................. 93125330 A

(51) Int. Cl.
*H01L 21/00* (2006.01)
(52) U.S. Cl. ...................................... 438/57; 427/427.1
(58) Field of Classification Search ............. 427/427.1, 427/427.2; 438/57
See application file for complete search history.

(56) References Cited

U.S. PATENT DOCUMENTS

| 5,156,336 | A | | 10/1992 | Hammond et al. ..... 239/214.25 |
|---|---|---|---|---|
| 5,306,345 | A | * | 4/1994 | Pellet et al. ................. 118/301 |
| 6,521,048 | B2 | | 2/2003 | Miller et al. ................. 118/729 |
| 6,984,842 | B1 | * | 1/2006 | Nayfeh et al. ................. 257/14 |

* cited by examiner

*Primary Examiner*—B. William Baumeister
*Assistant Examiner*—Matthew L. Reames
(74) *Attorney, Agent, or Firm*—Bacon & Thomas, PLLC

(57) ABSTRACT

A method for manufacturing a quantum-dot element is disclosed. The method includes the following steps. First, a deposition chamber having at least one atomizer and a substrate-supporting base is provided. The atomizer is connected to a gas inlet and a sample inlet. Afterwards, a sample solution is prepared composed of a plurality of functionalized quantum dots dispersed in a solvent. Simultaneously, a substrate is placed on the substrate-supporting base in the deposition chamber. Finally, the sample solution and a gas are transferred into the atomizer through the sample inlet and the gas inlet respectively for generating quantum-dot droplets, which subsequently deposit on the substrate in the deposition chamber. The quantum-dot element manufactured by the present invention has a uniform distribution of quantum dots that have a small size and, therefore, the quality of the quantum-dot element can be substantially improved.

12 Claims, 7 Drawing Sheets

METHOD OF MANUFACTURING A QUANTUM-DOT ELEMENT

BACKGROUND OF THE INVENTION

1. Field of the Invention

The present invention relates to a method for manufacturing a quantum-dot element and, more particularly, to a method for manufacturing a photoelectric element with colloidal quantum dots, such as a light-emitting diode, a laser diode, a detector, a photonic crystal, or a magnetic thin film.

2. Description of Related Art

Recently, the hybrid of organic or inorganic materials has become the emphasis of the development in photoelectric materials. On the other hand, the nano-particulate obtained by liquid or gaseous synthesis is also the focus of the development in material technology. Although the nano-particulate as well as the composite of the nano-particulate and the organic molecule inherently has good material property, they become deteriorated when being applied to the photoelectric devices. The main problem lies in that the manufacturing process of the nano-particulate is not compatible with the vacuum process for manufacturing the photoelectric element and, therefore, the manufacturing of the photoelectric element with the nano-particulates can not be carried out in a continuous process.

Generally, the quantum dot of the quantum-dot element is formed by either vacuum process or chemical synthesis. The vacuum process further includes the Molecular Beam Epitaxy (MBE) method, the Chemical Vapor Deposition (CVD) method, and the Ultrahigh Vacuum Physical Vapor Deposition (UHVPVD) method. However, the quantum dots formed by these vacuum processes usually have too large particle sizes (usually larger than 10 nm) and too low densities. Also, the particle sizes are not uniform enough. Therefore, the quantum dots formed by the vacuum process are unsuitable for a manufacturing device with a large superficial content. As for the chemical synthesis, it can produce quantum dots with well-distributed size, which generally ranges from 1 nm to 10 nm. In addition, the quantum dots formed by the chemical synthesis have a higher density, so they can be used to manufacture devices with large superficial content. The quantum-dot layer formed by the conventional chemical synthesis is shown as FIGS. 1a to 1c. First, the particles 10 and the organic molecules 20 are mixed in an atmosphere of inert gas, which prevents the particles 10 from oxidizing. Namely, the quantum dots are dispersed in the organic solvent, as shown in FIG. 1a. Afterwards, the quantum dots in the organic solvent are deposited onto the substrate 30 by spin coating in the grove box, as shown in FIG. 1b. Subsequently, the substrate 30 is put into the vacuum evaporation chamber or the sputtering chamber for depositing a carrier transport film or an electrode 40, as shown in FIG 1c. However, the quantum dots may easily aggregate in the aforesaid process, as shown in FIG. 2c. Besides, the product is easily contaminated during the mixing or the spin coating step, and consequently suffers from quality deterioration. Moreover, the product might be damaged when it is transported between different manufacturing apparatuses. In addition to the above-mentioned method, the quantum dots may also be adsorbed onto the substrate by dipping. However, although a uniform layer of quantum dots can be formed, the solvent might easily contaminate other parts of the quantum-dot element such as the carrier transport layer or the electrode.

In order to overcome the imperfection of such a non-continuous process, the apparatus for manufacturing quantum-dot element of the present invention combines the conventional aerosol spraying process with the vacuum process. In particular, the aerosol spraying process is used for introducing the solid powders. Therefore, the organic-inorganic composite element can be manufactured in a single chamber, and the bottleneck of deterioration in material quality can be substantially improved.

SUMMARY OF THE INVENTION

The object of the present invention is to provide a method for manufacturing a quantum-dot element so that the quantum dots can be distributed uniformly, the sizes of quantum dots can lie in the nano-order, and the performance of the quantum-dot element in light, electricity, and magnetism can be improved. Furthermore, the electrode layer, the emitting material layer, and the carrier transport layer of the quantum-dot element can all be formed in the same apparatus, and thus the quality loss due to transferring between different apparatuses can be substantially avoided.

In order to achieve the above object, the method for manufacturing a quantum-dot element of the present invention includes the following steps. First, a deposition chamber having at least one atomizer and a substrate-supporting base is provided. The atomizer is connected to a gas inlet and a sample inlet. Afterwards, a sample solution is prepared by dispersing a plurality of functionalized quantum dots in a solvent. Simultaneously, a substrate is placed on the substrate-supporting base in the deposition chamber. Finally, the sample solution, together with a gas is transferred into the atomizer for generating quantum-dot droplets, which subsequently deposit on the substrate in the deposition chamber. More specifically, the sample solution and the gas are fed respectively through the sample inlet and the gas inlet.

The method for manufacturing a quantum-dot element of the present invention can produce devices having the functionalized quantum dots, for example, a light-emitting diode, a laser diode, a detective device such as a light sensor or chemical sensor, photonic crystals, light modulators, or a magnetic thin film.

Generally, the quantum-dot element is constructed of a bottom electrode layer, a buffer layer, a quantum-dot layer, another buffer layer, and a top electrode layer formed on a substrate. The buffer layer is usually composed of at least one carrier injection/exportation layer pair, and can also be omitted optionally. The substrate can be an ITO glass substrate, a silicon substrate, an $Al_2O_3$ substrate, or a GaAs substrate.

When the method of the present invention is carried out, the substrate with or without the bottom electrode layer is fixed on the substrate-supporting base in the deposition chamber first. Subsequently, the buffer layer or the electrode layer is formed by the vacuum deposition process, for example, the Chemical Vapor Deposition (CVD) process, or the Physical Vapor Deposition (PVD) process such as evaporation or sputtering. Therefore, the deposition chamber could be a CVD chamber, an evaporation chamber, or a sputtering chamber. Afterwards, a sample solution is prepared by considering the size of the droplet sprayed out from the atomizer, the property of the solvent, and the volume of the functionalized quantum dot according to the method of the present invention. Owing to the functionalized group, the quantum dots can be dispersed in the solvent uniformly. Thereafter, the sample solution is sprayed onto the surface of the substrate by the atomizer to form a quantum-dot layer.

Moreover, the quantum dot can be a metal quantum dot, a semiconductor quantum dot, a magnetic quantum dot, an organic molecule quantum dot, or a polymer quantum dot. In addition, the diameter of the quantum dot formed by the present invention is less than 100 nm, and preferably ranges from several nano-meters to tens of nano-meters. The dispersion medium of the quantum dots, i.e. the solvent, can be water, an aqueous solution containing a surface-active agent, a polar organic solvent such as methanol, a non-polar organic solvent such as toluene, or a polymer solvent such as a diluted solution of a conjugate polymer, an epoxy resin, polymethylmethacrylate, polycarbonate, or a cyclic olefin co-polymer. The type of the atomizer is not restricted, and can be the conventional atomizer that sprays droplets by mixing and pressurizing the gas with the solution, or the supersonic atomizer that produces droplets by using the vibration energy of the piezoelectric ceramics. Besides, the substrate-supporting base is preferably a rotary plate that can drive the substrate to rotate and heat the substrate. More preferably, the substrate support base can adjust the rotation speed and the temperature of the substrate. Preferably, one shutter is mounted between the substrate supporting base and the atomizer, and the other shutter is mounted between the substrate supporting base and the evaporation or sputtering source for preventing the unstable evaporation or sputtering source from depositing on the substrate at the beginning of the heating of the evaporation or sputtering source. Similarly, at the initial stage of the spraying of the sample solution, the droplets are not uniform enough. Therefore, the shutter is also used for blocking the non-uniform droplets from arriving at the substrate.

The sample solution is prepared by dispersing proper amount of quantum-dot powder in the solvent. Also, the concentration of the sample solution is calculated to produce droplets containing a predetermined quantity of quantum dots.

For example, the average diameter of the functionalized quantum-dot powder is 20 nm, and the average diameter of the droplet sprayed from the atomizer is 100 nm. If each droplet is predetermined to contain only one quantum-dot powder, then the volume concentration of the sample solution can be calculated as the following equation (1):

$$(20\ nm)^3/\{(100\ nm)^3+(20\ nm)^3\}=4.63\times10^{-3}=0.463V\% \quad (1)$$

If each droplet is predetermined to contain fifteen quantum-dot powders, then the volume concentration of the sample solution can be calculated as the following equation (2):

$$[15\times(20\ nm)^3]/[(100\ nm)^3+15\times(20\ nm)^3]=0.1071=10.71V\% \quad (2)$$

If for a pair of droplets, only one contains a quantum-dot particle and the other does not, then the volume concentration of the sample solution will be half the concentration of equation (1).

DETAILED DESCRIPTION OF THE PREFERRED EMBODIMENTS

Embodiment 1

Preparation of the Sample Solution Containing CdSe/ZnS Quantum Dot with a Diameter of 3 nm The sample solution is introduced by a piezoelectric atomizer to form toluene droplets with an average diameter of 1000 nm. If the influence to the diameter of the droplet caused by the CdSe/ZnS quantum dot is neglected and if each droplet is predetermined to have one quantum-dot particle, then the volume concentration of the sample solution can be calculated as the following equation (3):

$$(3\ nm)^3/\{(1000\ nm)^3+(3\ nm)^3\}=9.00\times10^{-9} \quad (3)$$

If each droplet is predetermined to have three quantum-dot particles, then the desired concentration will be three times the concentration obtained from equation (3). Similarly, if each pair of droplets has only one quantum-dot particle, then the desired concentration will be half the concentration obtained from equation (3).

Embodiment 2

Preparation of the Sample Solution Containing ZnO Particle with a Diameter of 1 μm The sample solution is introduced by a conventional atomizer to form water droplets with an average diameter of 15 μm. If the influence to the diameter of the droplet caused by the ZnO particle is neglected and if each droplet is predetermined to have one particle, then the volume concentration of the sample solution can be calculated as the following equation (4):

$$(1\ \mu m)^3/\{(15\ \mu m)_3+(1\ \mu m)^3\}=2.96\times10^{-4} \quad (4)$$

The volume concentration calculated from equation (4) equals to a weight concentration of $1.62\times10^{-3}$.

If each droplet is predetermined to have five particles, then the desired concentration will be five times the concentration obtained from equation (4). Similarly, if each pair of droplets contains only one particle, then the desired concentration will be half the concentration obtained from equation (4).

Embodiment 3

Preparation of the Sample Solution Containing Silica Nano-Particle with a Diameter of 20 nm The sample solution is introduced by a piezoelectric atomizer to form water droplets with an average diameter of 100 nm. If the influence to the diameter of the droplet caused by the silica particle is neglected and if each droplet is predetermined to have one particle, then the volume concentration of the sample solution can be calculated as the following equation (5):

$$(20 \text{ nm})^3/\{(100 \text{ nm})^3+(20 \text{ nm})^3\}=4.63\times10^{-3}= 0.463V\% \quad (5)$$

If each droplet is predetermined to have fifteen particles, then the desired concentration will be fifteen times the concentration obtained from equation (5). Similarly, if each pair of droplets contains only one particle, then the desired concentration will be half the concentration obtained from equation (5).

Embodiment 4

Manufacturing of the Light-Emitting Element having ZnSe Quantum Dots

Figure 3:
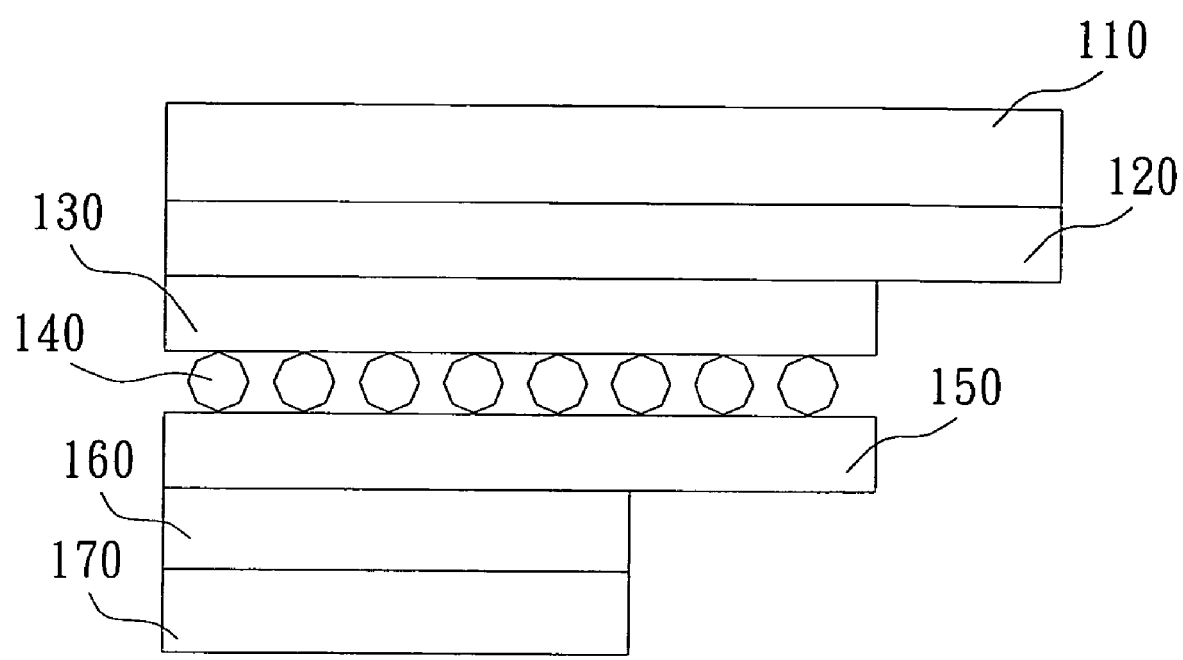
FIG. 3 is a schematic view showing the structure of the light-emitting element having a ZnSe quantum-dot layer formed by the present invention.

With reference to FIG. 3, there is shown a schematic view of the light-emitting element having ZnSe quantum dots according to the present invention. The light-emitting element includes a glass substrate 110, on which an anode layer 120 made of the conductive glass, a hole transport layer (HTL) 130, an emitting material layer (EML) 140 composed of CdSe quantum dots, an electron transport layer (ETL) 150, and a cathode layer 170 made of aluminum are formed sequentially. Moreover, there is usually a LiF layer 160 formed between the cathode layer 170 and the electron transport layer 150.

In the present embodiment, the EML, the HTL, and the ETL can be made of any conventional materials, which are listed in the following table:

Wherein the above abbreviations are defined as follows:

NPB:
N,N'-di(naphthalen-1-yl)-N,N'-di(phenyl)benzidin,

α-NPB:
N,N'-Bis(naphthalen-1-yl)-N,N'-bis(phenyl)benzidine,

DMFL-NPB:
N,N'-di(naphthalen-1-yl)-N,N'-di(phenyl)-9,9-dimethyl-fluorene,

TPD:
N,N'-Bis-(3-methylphenyl)-N,N'-bis-(phenyl)-benzidine,

Spiro-TPD:
N,N'-bis-(3-methylphenyl)-N,N'-bis-(phenyl)-spiro,

DMFL-TPD:
N,N'-bis(3-methylphenyll)-N,N'-bis(phenyl)-9,9-diphenyl-fluorene,

Spiro-NPB:
N,N'-di(naphthalen-1-yl)-N,N'-diphenyl-spiro),

TCP:
1,3,5-tris(carbazol-9-yl)-benzene,

TNB:
N,N,N',N'-tetrakis(naphth-1-yl)-benzidine,

MCP:
1,3-bis(carbazol-9-yl)-benzene,

PVK:
poly (N-vinyl carbazole),

PEDOT:
poly (ethylenedioxythiophene,

PSS:
poly (styrene sulfonic acid),

MEH-PPV:
Poly(2-mthoxy-5-(2'-ethylhexyloxy)-1,4-phenylenevi-nylene),

MEH-BP-PPV:
Poly[2-Methoxy-5-(2'-ethylhexyloxy)-1,4-phenylenevi-nylene-co-4,4'-bisphenylenevinylene], PF-BV-MEH:
Poly[(9,9-dioctylfluoren-2,7-diyl)-co-(1,4-diphenylene-vi-nylene-2-m ethoxy-5-{2-ethylhexyloxy}benzene)],

| Material | Light-Emitting | Green | Red | Yellow | Blue | White |
|---|---|---|---|---|---|---|
| Small molecule material | EML | Alq、DPT、Alq₃、Bebq₂、DMQA、Coumarin6、Q、NMQ、Quinacrine | DCM-2、TMS-SiPc、DCJTB、ABTX | Rubrene | TPAN、DPAN、DPAP、Perylene($C_{20}H_{12}$)、DPVBi、PPD、a-NPD₂、b-NPD、TTBND、DCTA、TDAPTz | TTBND/BTX-1 |
| | HTL | TPAC、TPD、a-NPD、2Me-TPD、FTPD、Spiro-TPD(TAD)、t-TNATA、OTPAC、CuPc、TPTE、m-MTDATA | | | | |
| | ETL | Alq₃、Bebq₂、BND、OXD、ZnPBT、PBD、TAZ | | | | |
| Polymer material | EML | PPV、PF、MEH-PPV | | | | |
| | HTL | PEDOT、PAni、PVK、PTPDES | | | | |

Figure 4:
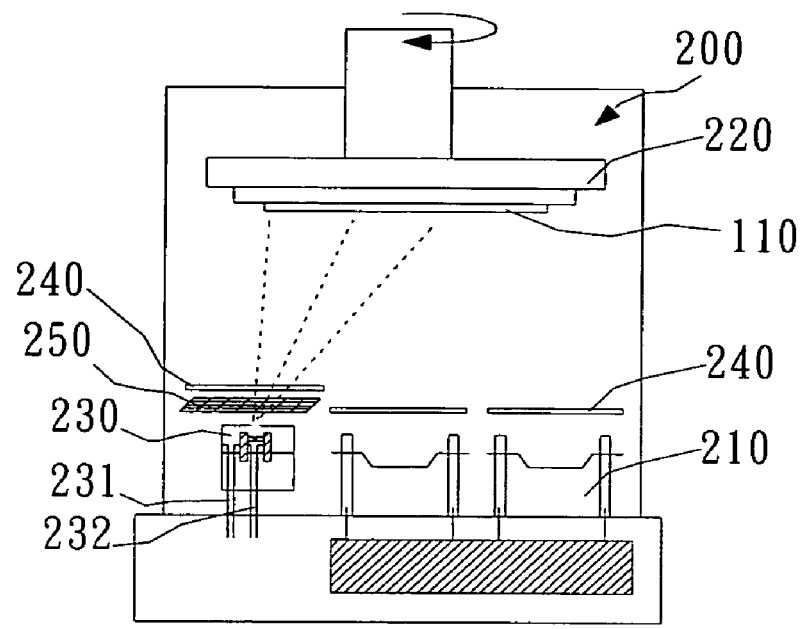
FIG. 4 is a schematic view showing the first preferred embodiment of the apparatus for manufacturing the quantum-dot element of the present invention.

PF-DMOP:
Poly[(9,9-dioctylfluoren-2,7-diyl)-co-(2,5-dimethoxyben-zen-1,4-diyl)], PFH:
Poly[(9,9-dihexylfluoren-2,7-diyl)-alt-co-(benzen-1,4-diyl)], PFH-EC:
Poly[(9,9-dihexylfluoren-2,7-diyl)-co-(9-ethylcarbazol-2,7-diyl)], PFH-MEH:
Poly[(9,9-dihexylfluoren-2,7-diyl)-alt-co-(2-methoxy-5-{2-ethylhex yloxy}phenylen-1,4-diyl)], PFO:
Poly[(9,9-dioctylfluoren-2,7-diyl), PF-PPV:
Poly[(9,9-di-n-octylfluoren-2,7-diyl)-co-(1,4-vinylenephe-nylene)], PF-PH:
Poly[(9,9-dihexylfluoren-2,7-diyl)-alt-co-(benzen-1,4-diyl)], PF-SP:
Poly[(9,9-dihexylfluoren-2,7-diyl)-alt-co-(9,9'-spirobifluo-ren-2,7-diy 1)], Poly-TPD:
Poly(N,N'-bis(4-butylphenyl)-N,N'-bis(phenyl)benzidine, Poly-TPD-POSS:
Poly(N,N'-bis(4-butylphenyl)-N,N'-bis(phenyl)benzidine, TAB-PFH:
Poly[(9,9-dihexylfluoren-2,7-diyl)-co-(N,N'-di(4-butylphe-nyl)-N,N'-diphenyl-4,4'-diyl-1,4-diaminobenzene)], PPB:
N,N'-Bis(phenanthren-9-yl)-N,N'-diphenylbenzidine, Alq$_3$:
Tris-(8-hydroxyquinoline) aluminum, BAlq$_3$:
(Bis-(2-methyl-8-quinolinolate)-4-(phenylphenolato)-alu-mium), BCP:
2,9-Dimethyl-4,7-diphenyl-1,10-phenanthroline, CBP:
4,4'-Bis(carbazol-9-yl)biphenyl, TAZ:
3-(4-Biphenylyl)-4-phenyl-5-tert-butylphenyl-1,2,4-triazole In the present embodiment, the apparatus for manufacturing the quantum-dot element is shown in FIG. 4. An evaporation chamber 200 having a plurality of evaporation sources 210 is used to deposit the hole transport layer, the quantum-dot emitting layer, and the electron transport layer on the substrate 110. A substrate-supporting base 220 is located in the evaporation chamber 200 for fixing the substrate 110. In addition, an atomizer 230 is used to pressurize the mixture of a gas and a solution. More specifically, nitrogen and a toluene solution containing functionalized CdSe quantum dots are sprayed into the evaporation chamber 200 for generating droplets containing quantum dots. Nitrogen and the toluene solution are fed respectively through a gas inlet 231 and a sample inlet 232, both of which are connected with the atomizer 230. Furthermore, several shutters 240 are mounted between the substrate-supporting base and the atomizer 230, as well as between the substrate supporting base and the evaporation sources 210. Owing to the shutters 240, the atomizer 230 and the evaporation sources 210 can be switched and prevented from contaminating with each other. Preferably, a sieve 250 is mounted between the atomizer 230 and the shutter 240 for controlling the size of droplets that deposit on the substrate 110. Besides, the atomizer 230 is disposed at the bottom of the chamber 200, and the substrate-supporting base 220 is located at the top of the chamber 200. Hence, the droplets transported upwardly can deposit uniformly on the substrate and form a quantum-dot layer with uniform distribution of quantum dots.

The substrate-supporting base 220 is a rotary plate that drives the substrate to rotate. Also, the substrate-supporting base 220 can heat the substrate so as to increase the uniformity of the hole transport layer and electron transport layer formed by evaporation, as well as the quantum-dot emitting layer formed by atomization. In addition, the solvent on the substrate can be driven out accordingly. The evaporated material includes an organic molecule, an organic metal, an organic semiconductor, a metal, a semiconductor, a hole or electron transport material, and a super conductive material. In particular, the organic molecule contains a small organic molecule that has a molecular weight less than 100,000, and an organic polymer. The organic metal is the molecule having a metal and an organic group such as C—R, O—R, N—R, or S—R group, wherein R represents an organic molecule. The organic semiconductor contains the organic compound that has an electrically conductive property and a light-emitting property, such as a conjugate polymer. The metal includes groups 1A, 2A, 3A, 4A, 5A, 6A, 7A, 8A, 1B, and 2B metals in the periodic table. The semiconductor contains the semiconductors of groups 4B and the compound semiconductors of groups 1B, 2B, 3B, 4B, 5B, 6B, AND 7B. The hole or electron transport material includes the hole or electron transport materials used for the PLED and OLED. As for the super conductive material, it includes the compounds that have at least two of Y, Ba, Cu, and O elements and other superconductors.

Figure 1A:
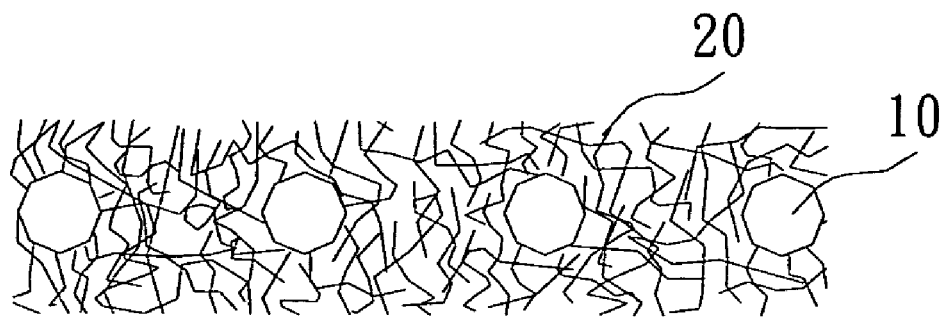
FIGS. 1a~1c are schematic views showing the formation of the quantum-dot layer by the chemical synthesis of prior art.
Figure 1B:
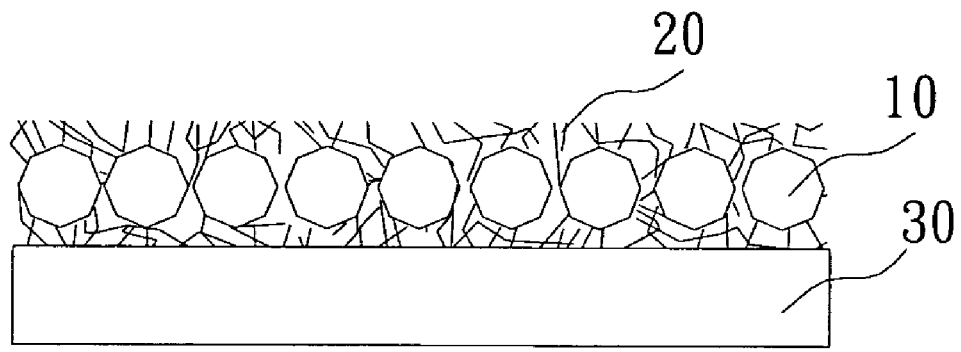
Figure 1C:
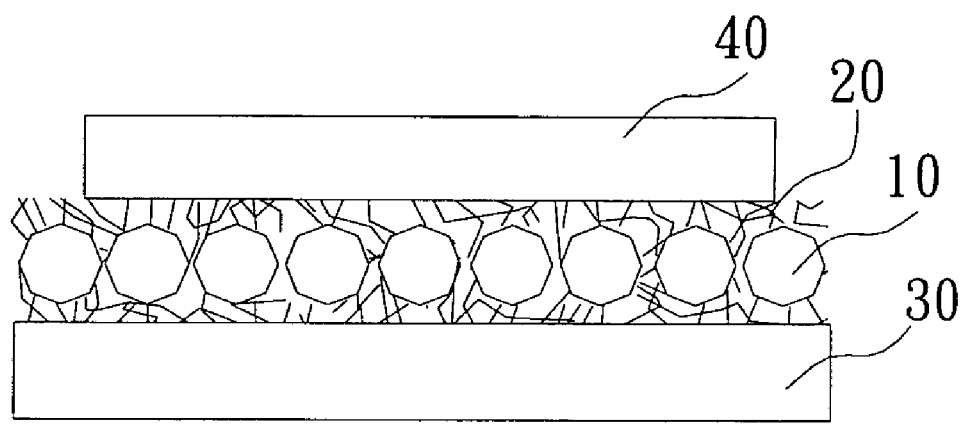
Figure 2A:
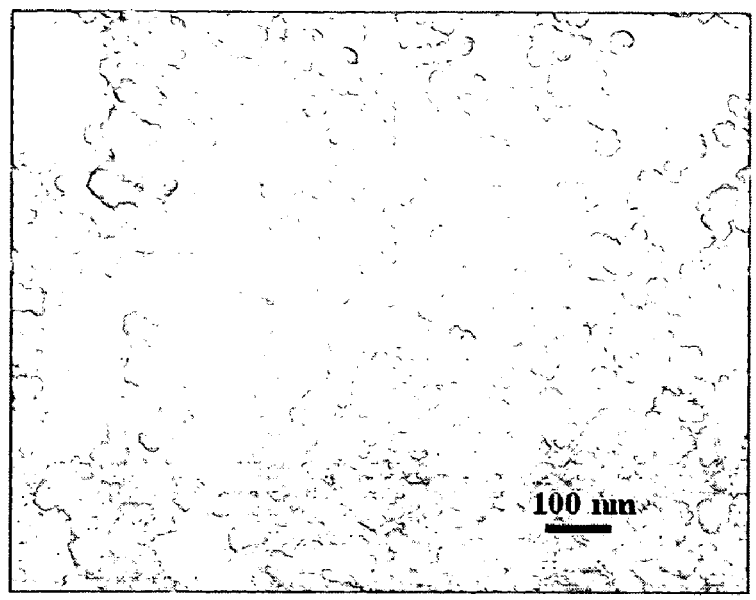
FIG. 2a is an SEM picture showing the distribution of quantum dots in the quantum-dot layer of prior art.
Figure 2B:
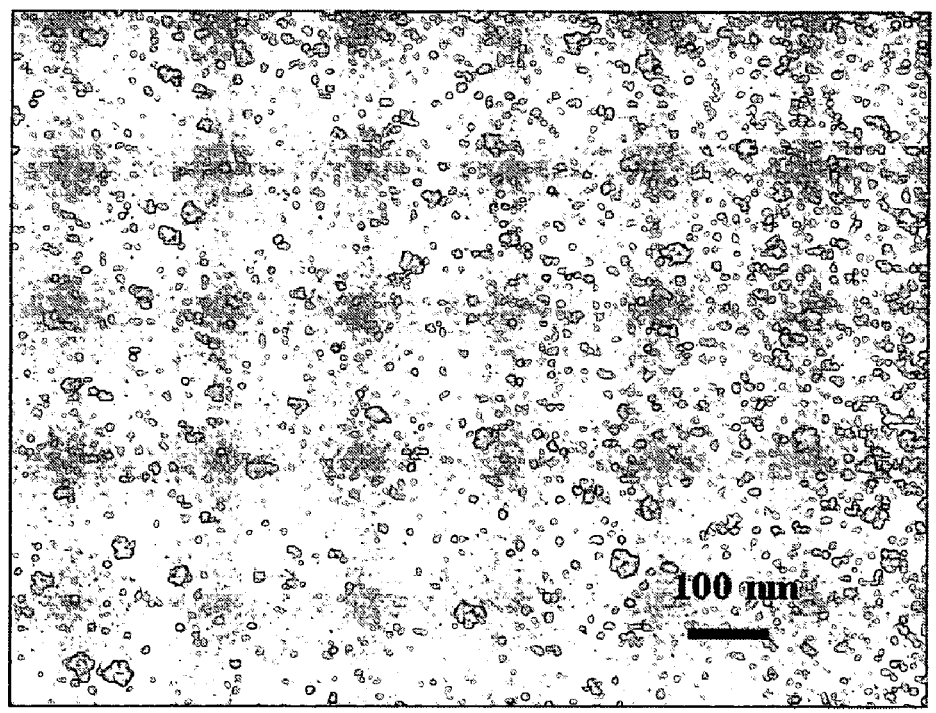
FIG. 2b is an SEM picture showing the distribution of quantum dots in the quantum-dot layer formed by the present invention.

When the method of the present invention is carried out, the substrate 110 having the anode layer 120 made of the conductive glass is transferred into the evaporation chamber 200 and fixed on the substrate supporting base 220 first. Simultaneously, the evaporation source 210 is turned on under vacuum condition to form a hole transport layer 130 on the substrate 110. Afterwards, a high-pressure gas is used to spray out the droplets containing functionalized quantum dots through the atomizer 230. Subsequently, the evaporation source 210 of the electron transport layer 150 is turned on to form the electron transport layer 150 on the glass substrate 110. Finally, the glass substrate 110 is transferred out of the chamber, and then sent to other apparatus for depositing the cathode layer 170. At this point, the manufacture of the light-emitting element is finished. The distribution of quantum dots in the quantum-dot emitting layer 140 can be shown as FIG. 2b.

Figure 5:
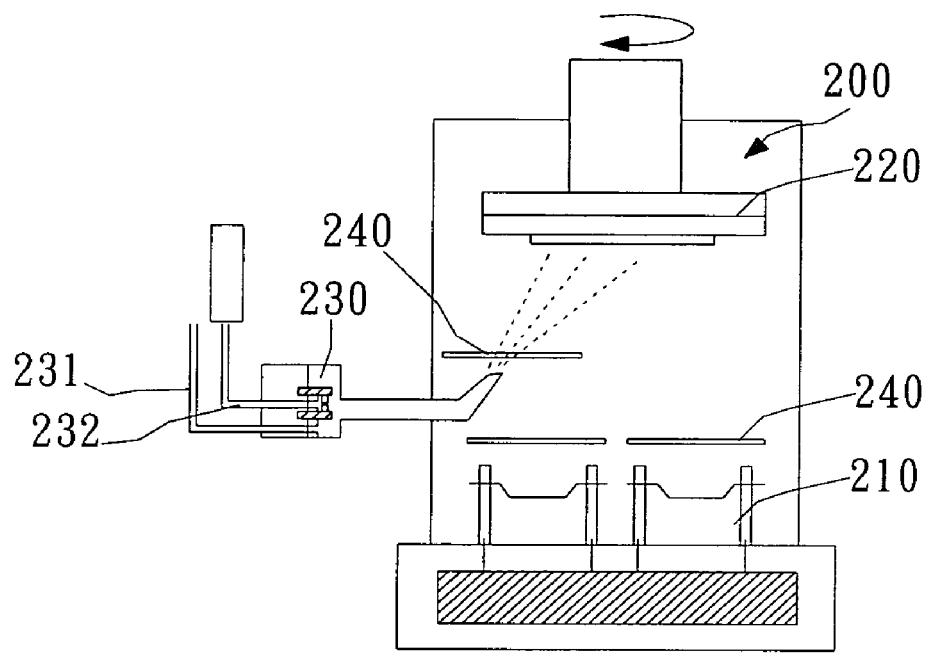
FIG. 5 is a schematic view showing the second preferred embodiment of the apparatus for manufacturing the quantum-dot element of the present invention.
Figure 6:
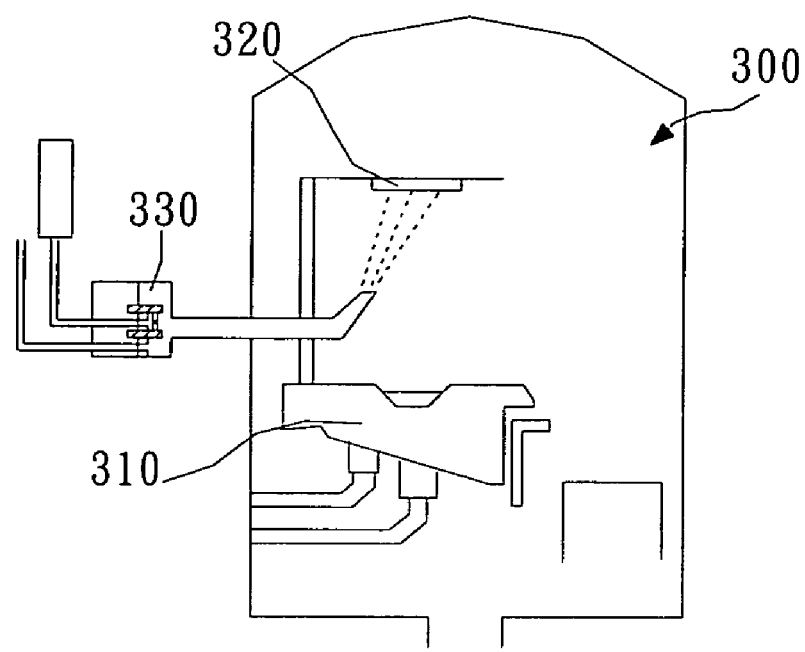
FIG. 6 is a schematic view showing the third preferred embodiment of the apparatus for manufacturing the quantum-dot element of the present invention.
Figure 7:
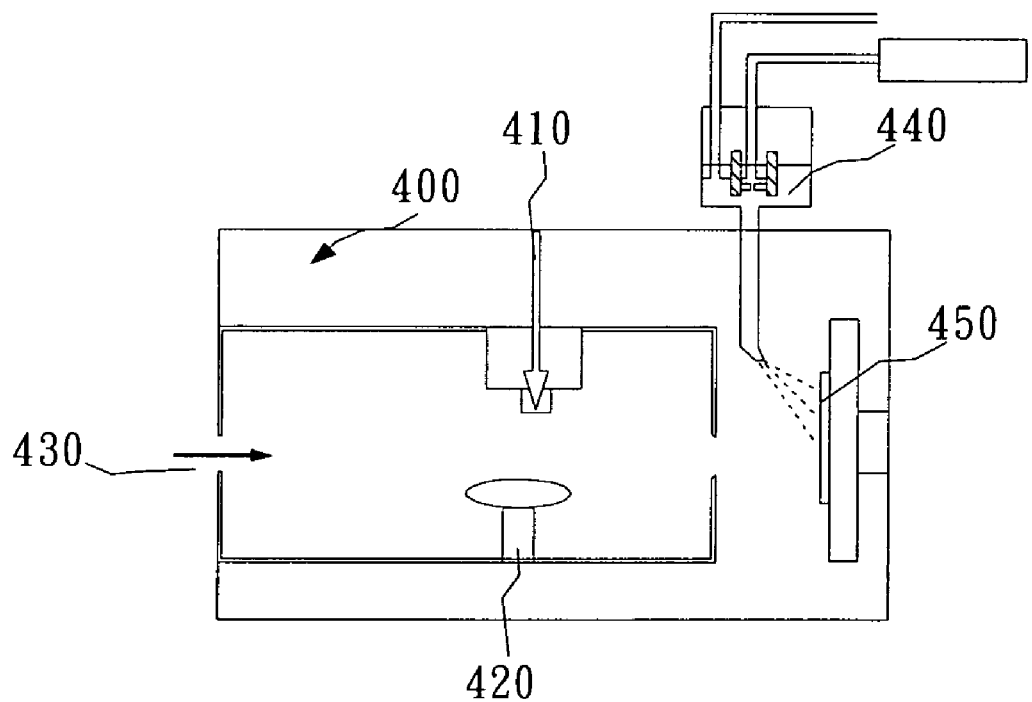
FIG. 7 is a schematic view showing the fourth preferred embodiment of the apparatus for manufacturing the quantum-dot element of the present invention.
Figure 8:
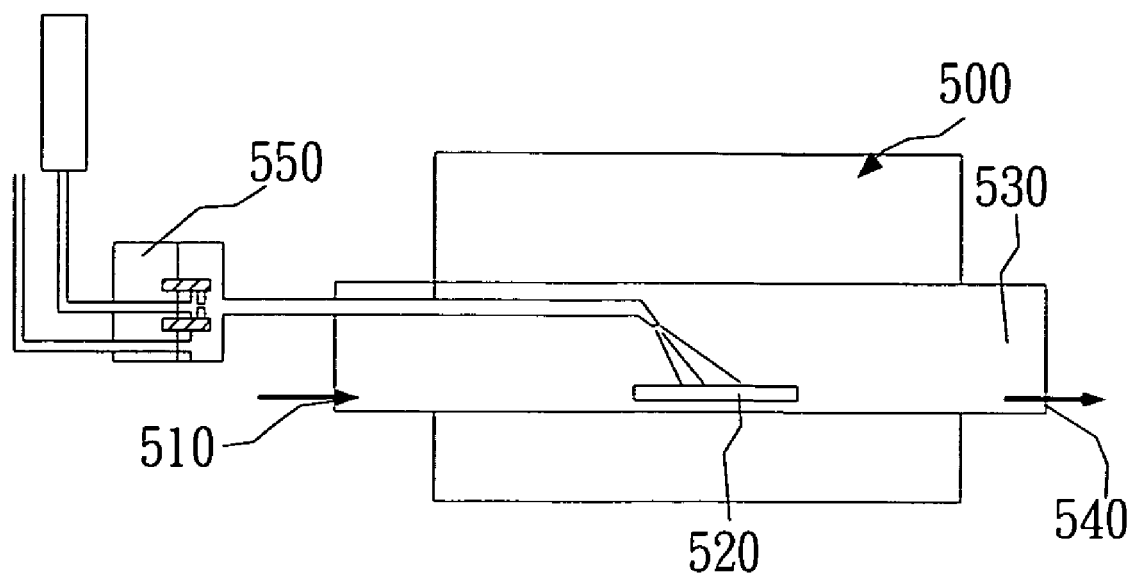
FIG. 8 is a schematic view showing the fifth preferred embodiment of the apparatus for manufacturing the quantum-dot element of the present invention.

The atomizer 230, the gas inlet 231, and the sample inlet 232 are mounted inside the chamber 200 in the present embodiment. Also, those parts can be mounted outside of the chamber 200 except the spray head of the atomizer 230, as shown in FIG. 5. In this preferred embodiment, the crucible is used to serve as the evaporation source, which is melted by the thermal resistance materials such as a tungsten line or a tantalum line. However, the deposition chamber 300 can also use an electron-beam gun 310 to melt the evaporation source, and an externally connected removable atomizer 330 to deposit a thin film on the substrate 320, as shown in FIG. 6. Alternatively, with reference to FIG. 7, the laser 410 can be used to gasify the target 420 in the chamber 400, and the gas 430 can transfer the gasified target material to form the electrode layer or the buffer layer on the substrate 450. Also, a removable atomizer 440 is externally connected to form the quantum-dot layer on the substrate 450. Furthermore, in the quartz tube 530 of the chamber 500, a film is formed on the substrate 520 by the Chemical Vapor Deposition process, as shown in FIG. 8. More particularly, the feed inlet 510 is located at one end of the quartz tube 530, and at the other end of the quartz tube 530, there is an outlet 540 connecting with a pump. The outlet 540 can generate a pressure difference in the quartz tube 530. Thus, the pressure difference drives the gas to flow and form a film on the substrate 520. Similarly, the atomizer 550 serves to form the quantum dots in the film.

In the present invention, the carrier transport layer can be deposited optionally before or after the quantum-dot layer is formed. Alternatively, the carrier transport layer and the quantum-dot layer can be formed by turns. Finally, the electrode layer can also be deposited in the same chamber. As the above-mentioned steps are all carried out in the vacuum chamber, they can be accomplished in a continuous process. Consequently, the manufacturing time and cost are reduced. Besides, the product is effectively prevented from being contaminated. Moreover, the quantum dots can be distributed uniformly on the substrate due to the spraying of the atomizer. The size of the quantum dots can be reduced to nano-meter level successfully.

Figure 9A:
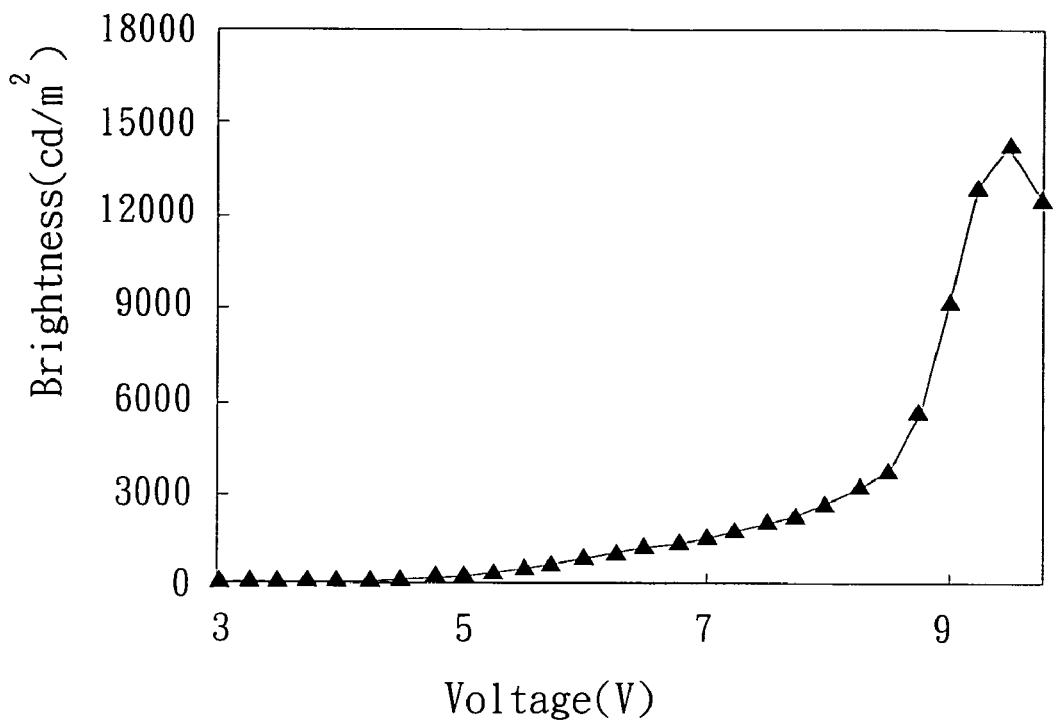
FIG. 9a is a figure showing the relationship between the brightness and the voltage of the light-emitting element manufactured by the present invention.
Figure 9B:
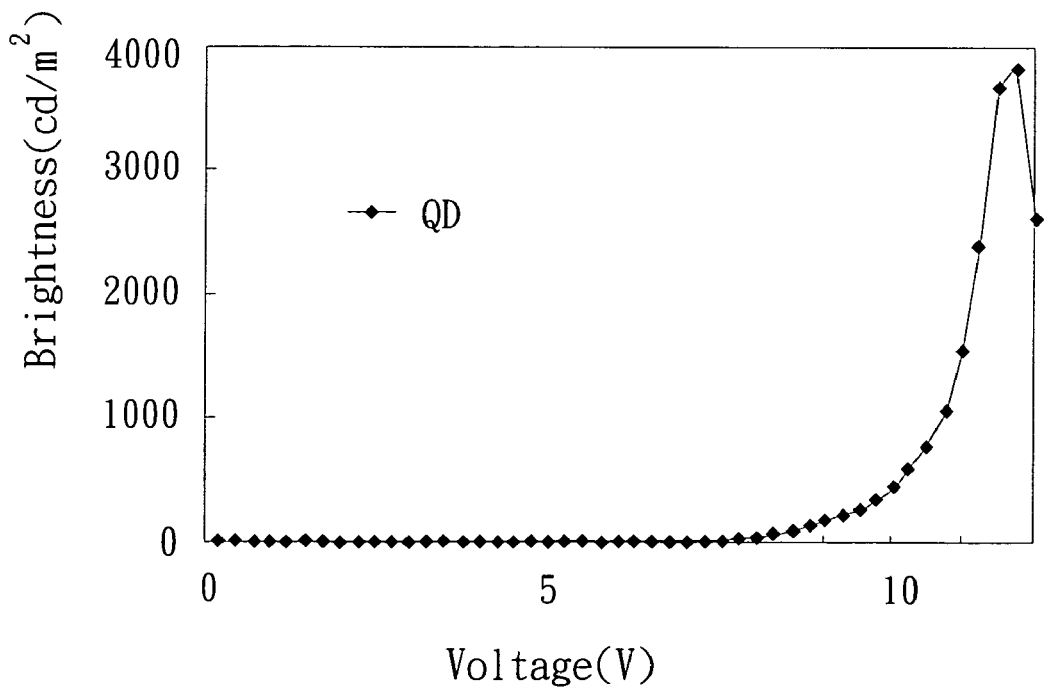
FIG. 9b is a figure showing the relationship between the brightness and the voltage of the light-emitting element manufactured by the prior art.

The relationship between the brightness and the exerted voltage of the emitting element having ZnSe quantum dots formed by the present invention is compared with that of the conventional emitting element, of which the quantum-dot layer is formed by coating. As shown in FIG. 9a, the brightness of the emitting element manufactured by the present invention reaches 10,000 lumens as the voltage is 9V. However, the brightness of the conventional emitting element is less than 1,000 lumens as the voltage is 9V, as shown in FIG. 9b. Therefore, the emitting element manufactured by the method of the present invention exhibits a substantially improved light-emitting efficiency.

The above detailed descriptions are given by way of example and not intended to limit the invention solely to the embodiments described herein.

What is claimed is:

1. A method for manufacturing a quantum-dot element, comprising the steps of:
   providing a deposition chamber having at least one atomizer, a plurality of evaporation sources and a substrate-supporting base, wherein the atomizer is connected to a gas inlet and a sample inlet;
   preparing a sample solution composed of a plurality of functionalized quantum dots dispersed in a solvent and simultaneously placing a substrate on the substrate supporting base in the deposition chamber; and
   transferring the sample solution and a gas into the atomizer through the sample inlet and the gas inlet respectively for generating quantum-dot droplets, which subsequently deposit on the substrate in the deposition chamber;
   wherein the substrate-supporting base is a rotary plate that drives the substrate to rotate and heats the substrate.

2. The method as claimed in claim 1, wherein the volumetric concentration of the sample solution equals to the volume of the functionalized quantum dot divided by the average volume of the quantum-dot droplets and ranges from 0 to 99%.

3. The method as claimed in claim 1, wherein the substrate is a glass substrate, a silicon substrate, an $Al_2O_3$ substrate, or a GaAs substrate.

4. The method as claimed in claim 1, wherein the substrate further has a metal film, a semiconductor film, or an organic molecule film formed on its surface.

5. The method as claimed in claim 1, wherein the quantum dot is a metal quantum dot, a semiconductor quantum dot, a magnetic quantum dot, an organic molecule quantum dot, or a polymer quantum dot.

6. The method as claimed in claim 1, wherein the diameter of the quantum dot is smaller than 100 nm.

7. The method as claimed in claim 1, wherein the solvent is water, an aqueous solution containing a surface-active agent, a polar organic solvent, a non-polar organic solvent, or a polymer solvent.

8. The method as claimed in claim 1, wherein the gas is an inert gas or nitrogen.

9. The method as claimed in claim 1, wherein the deposition chamber is a chemical vapor deposition (CVD) chamber, an evaporation chamber, or a sputtering chamber.

10. The method as claimed in claim 1, wherein the sample solution and the gas are mixed and pressurized to be sprayed out from the atomizer.

11. The method as claimed in claim 1, wherein the atomizer is a supersonic atomizer.

12. The method as claimed in claim 1, wherein a shutter is further mounted between the substrate supporting base and the atomizer for switching the atomizer.

* * * * *

UNITED STATES PATENT AND TRADEMARK OFFICE
CERTIFICATE OF CORRECTION

| | |
|---|---|
| PATENT NO. | : 7,303,937 B2 |
| APPLICATION NO. | : 11/187829 |
| DATED | : December 4, 2007 |
| INVENTOR(S) | : Hsueh-Shih Chen et al. |

Page 1 of 1

It is certified that error appears in the above-identified patent and that said Letters Patent is hereby corrected as shown below:

In column 4, lines 41-42, in equation (3), please change the following:

--$9.00 \times 10^{-9}$-- to --$2.70 \times 10^{-8}$--

Signed and Sealed this
Fifth Day of April, 2011

David J. Kappos
*Director of the United States Patent and Trademark Office*